United States Patent [19]

Zimmerman et al.

[11] Patent Number: 4,490,408

[45] Date of Patent: Dec. 25, 1984

[54] METHOD AND DEVICE FOR METALLIZING THE INTERNAL SURFACE OF A HOLLOW OBJECT

[75] Inventors: Robert R. Zimmerman; Larry D. Kunkler, both of Beaverton; Earl R. Helderman, Hillsboro, all of Oreg.

[73] Assignee: Tektronix, Inc., Beaverton, Oreg.

[21] Appl. No.: 474,753

[22] Filed: Mar. 14, 1983

[51] Int. Cl.³ .......................... B05D 3/06; B05B 5/02
[52] U.S. Cl. ...................... 427/42; 427/38; 427/237; 427/238; 118/622
[58] Field of Search ............ 427/38, 42, 237, 238; 118/622

[56] References Cited

U.S. PATENT DOCUMENTS 4,039,699  8/1977  Morimoto et al. ............ 427/38
4,293,594 10/1981  Yoldas et al. ............... 427/237

Primary Examiner—John E. Kittle
Assistant Examiner—James J. Seidleck
Attorney, Agent, or Firm—John Smith-Hill

[57] ABSTRACT

A coating of metallic material is deposited on the internal surface of a hollow object. An elongate member comprising two electrical conductors extending side-by-side from end-to-end of the member has one end inside the hollow object and its opposite end outside the object. A filament has its two ends connected to the conductors respectively at the one end of the elongate member, and a crucible containing metal to be deposited is supported above the filament and in spaced relationship thereto. By supplying current to the filament by way of the conductors for the filament is heated to achieve thermonic emission. The filament and the crucible are connected to negative and positive terminals respectively of a potential source so that electrons emitted by the filament are accelerated towards the crucible and cause the crucible to be heated by electron bombardment.

8 Claims, 2 Drawing Figures

METHOD AND DEVICE FOR METALLIZING THE INTERNAL SURFACE OF A HOLLOW OBJECT

This invention relates to a method and device for metallizing the internal surface of a hollow object.

BACKGROUND OF THE INVENTION

In the manufacture of cathode ray tubes (CRTs) it is necessary to provide a coating of conductive material, e.g. aluminum, on the internal surface of the faceplate and the forward part of the funnel, in order to establish an electric field within the CRT for accelerating electrons from the electron gun, disposed in the neck of the CRT, to the faceplate.

Conventionally, the internal surface of a CRT is aluminized by inserting a braided tungsten filament, having one or more foils of aluminum draped over it, into the interior of the CRT. The filament is connected to a source of electrical energy, and the resultant heating of the filament causes the aluminum to boil, establishing an aluminum vapor inside the CRT. Vapor condenses on the internal surface of the CRT, providing the desired aluminum coating. Unfortunately, this process is expensive, since the tungsten filament must be replaced quite frequently, and it is also inconsistent, since the molten aluminum wicks along the filament so that the final location from which the aluminum evaporates is not the same as the initial location of the aluminum foils. In addition, the molten aluminum alloys with the tungsten of the filament, and causes the filament to be eroded and become brittle. The increased brittleness of the filament increases the risk of breakage, because there is necessarily a physcial impact to the filament each time a new foil is applied to the filament.

Erosion of the filament is a more serious problem than brittleness. Erosion does not occur uniformly along the length of the filament, but creates regions of reduced cross-section area along the filament. These regions become much hotter than other regions of the filament when the filament is heated, accelerating the erosion and necking of the filament. If the aluminum foil is not fully evaporated in each cycle, the residue builds up on the cooler regions of the filament, requiring a still higher current to heat these regions sufficiently to evaporate the aluminum, accelerating the erosion of the hotter regions. The filament ultimately fails at the eroded region.

Working of the filament clamps during heating and cooling of the filament also stresses the filament, making it more likely to break.

Electron beam (E-beam) apparatus is used for aluminizing objects in the manufacture of, e.g., hybrid circuits, integrated circuits and thin film devices. One conventional E-beam apparatus comprises a graphite crucible in which the aluminum is placed, and an E-beam source, which may be a scanning E-beam source. The crucible is biased at a positive potential, and the E-beam source is disposed to direct the E-beam downwardly into the aluminum in the crucible. The crucible, E-beam source and workpiece to be aluminized are all placed in an evacuated enclosure. The electrons impinge on the aluminum in the crucible, heating the aluminum and vaporizing it. Aluminum vapor condenses on the workpiece, providing the desired aluminum coating. E-beam aluminizing, as conventionally practiced, cannot be applied to CRTs, which are aluminized with the faceplate disposed generally horizontal and above the funnel, because it would require the E-beam source to be located inside the tube. It would be difficult, if not impossible, to provide an E-beam source small enough to fit inside a CRT, immediately beneath the faceplate, because the source would have to be inserted into the tube and removed from the tube by way of the neck of the tube.

SUMMARY OF THE INVENTION

According to a first aspect of the present invention there is provided a method of depositing a coating of metallic material on the internal surface of a hollow object which is formed with an opening for providing access to the interior of the object, comprising disposing an elongate member and the hollow member so that the elongate member extends upwardly into the interior of the object by way of the opening, one end of the elongate member being inside the hollow object while an opposite end of the elongate member is outside the object, said elongated member including mutually electrically-insulated conductors extending from said one end to said opposite end, a filament having two opposite ends connected to said conductors respectively at said one end of the elongate member, and a crucible containing metal to be deposited and supported at said one end of the elongate member above the filament and in spaced relationship thereto, at least a portion of the surface of the crucible facing the filament being electrically conductive, and said method also comprising supplying current to said filament by way of said conductors for heating said filament to achieve thermonic emission, and connecting the filament and said portion of the crucible to negative and positive terminals respectively of a potential source so that electrons emitted by the filament are accelerated towards the crucible and cause the crucible to be heated by electron bombardment.

According to a second aspect of the present invention there is provided a device for use in depositing a coating of metallic material on the internal surface of a hollow object which is formed with an opening for providing access to the interior of the object, comprising an elongated member having a first end which is insertable into the interior of the object by way of the opening, and a second end which remains outside the object, said elongated member including two mutually electrically-insulated conductors extending from said first end to second end, a filament having two opposite ends connected to said conductors respectively at said first end of the elongated member, whereby current can be supplied to said filament by way of said conductors for heating said filament to achieve thermionic emission, a crucible for containing metal to be deposited, at least a portion of the crucible being electrically conductive, support means for mounting the crucible at said first end of the elongated member in spaced relationship from the filament and with said portion of the crucible facing the filament, and means for connecting said portion of the crucible to the positive terminal of a potential source while the filament is connected to the negative terminal of the source so that electrons emitted by the filament are accelerated towards the crucible and cause the crucible to be heated by electron bombardment.

BRIEF DESCRIPTION OF THE DRAWING

For a better understanding of the invention, and to show how the same may be carried into effect, reference will now be made, by way of example, to the accompanying drawing in which.

DETAILED DESCRIPTION

Figure 1:
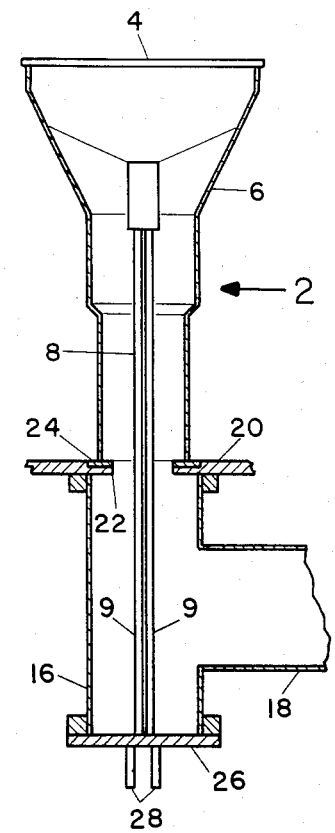
FIG. 1 is a simplified vertical sectional view of an aluminizing apparatus embodying the present invention, with the CRT to be aluminized in place.

The illustrated apparatus is used to aluminize the faceplate and the forward part of the funnel of a CRT 2. The CRT is disposed with its faceplate 4 generally horizontal and above the funnel 6. The apparatus includes a split rod assembly 8, comprising a pair of metal rods 9 which are mechanically secured together by means of screws 10 (only one of which is shown) but are maintained in electrical isolation from each other by means of ceramic balls 12 fitted in recesses of the rods 9 and insulating washers 14. The rods 9 are fitted axially in the cross-member 16 of a T tube joint which is disposed with the cross-member 16 vertical and has the center limb 18 connected to a vacuum source (not shown).

The upper end of the cross-member 16 is secured to a mounting plate 20 which is formed with a circular aperture 22. Recessed into the upper surface of the plate and surrounding the aperture 22 is a resilient seal 24. The lower end of the cross-member 16 is closed with a plate 26 to which the rods 9 are mounted so that they extend vertically upwards, through the aperture 22. The plate 26 is constructed to provide electrical connections to the rods 9 from two terminals 28 which are provided at the lower side of the plate 26.

Figure 2:
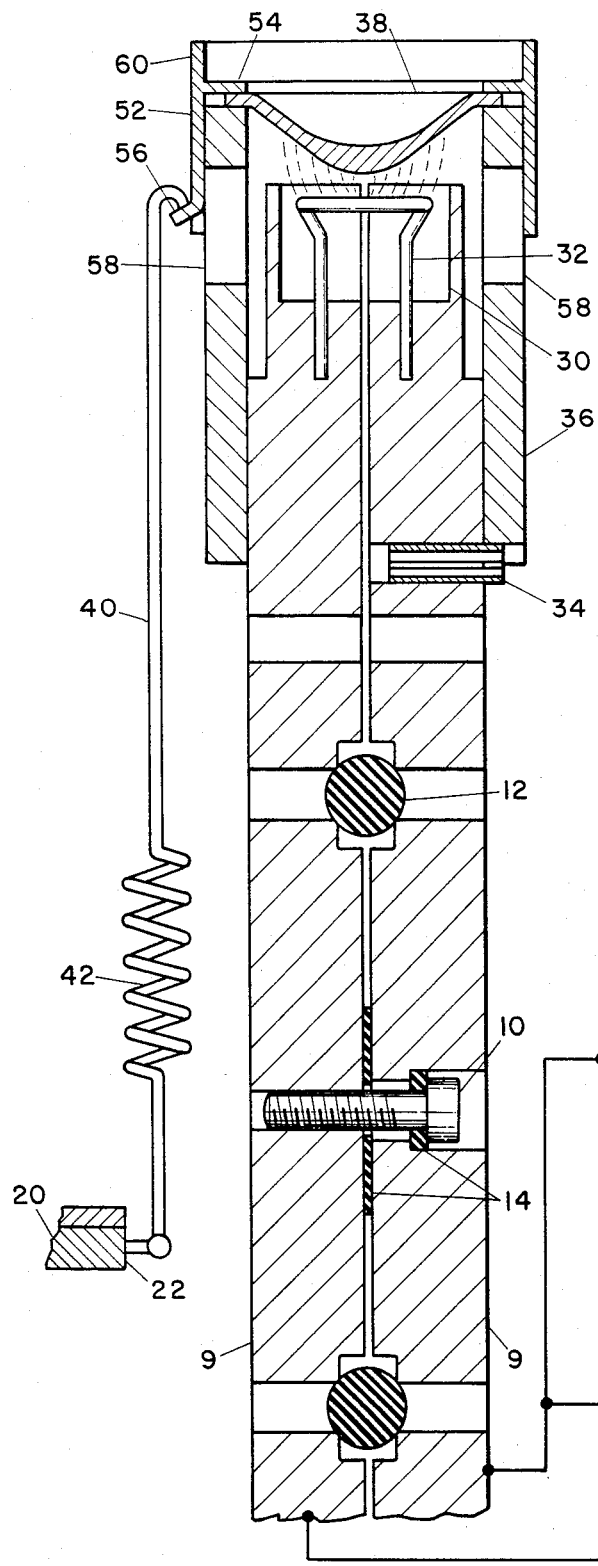
FIG. 2 is an enlarged, partial cross-sectional view of the apparatus, showing its structure in greater detail.
Figure 2:
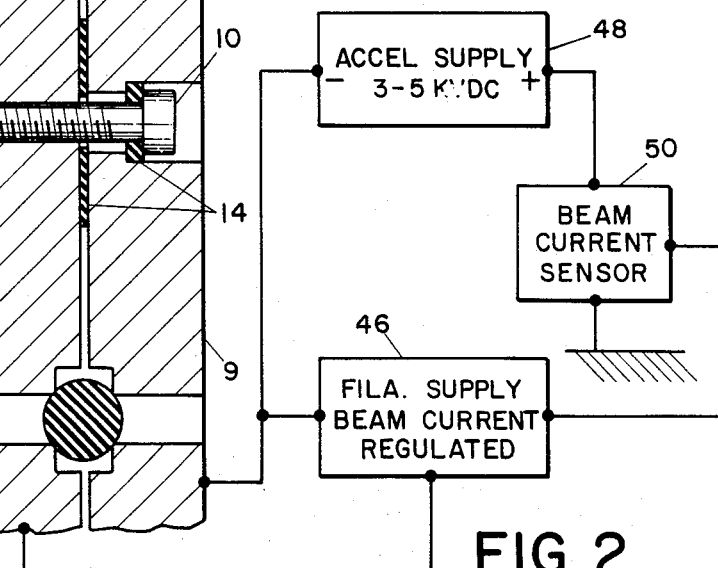

At their upper ends, the rods 9 are each formed with a semicylindrical recess so that when the rods are assembled as shown in FIG. 2 a generally cylindrical recess 30 is formed at the upper ends of the rod assembly. A filament 32 has two opposite ends fitted in respective cylindrical holes of the rods 8 and retained therein by means of locking screws (not shown). A locating pin 34 is fitted in a radial bore in one of the rods 8, and a sleeve of ceramic material such as alumina is fitted over the upper end of the rod assembly and rests on the pin 34. The upper end of the sleeve 36 is somewhat above the upper end of the rod assembly. A graphite crucible 38 is located on the upper end of the sleeve 36 with its rim engaging the top of the sleeve. A metal sleeve 52, e.g. of stainless steel, having an internal flange 54 is fitted over the sleeve 36 so that the flange 54 engages the rim of the crucible. The metal sleeve has a tab 56 bent out from its wall and formed with an opening (not shown). A stiff wire 40, including a spring 42, is disposed adjacent the rod assembly and is formed at one end with a hook 44 which engages the opening in the tab 56 and is secured at its other end to the plate 20 at the interior of the aperture 22.

A CRT to be metallized is disposed vertically on the mounting plate 20, as shown in FIG. 1, with the crucible located in the funnel of the CRT, beneath the faceplate and with the open rear end of the neck engaging the seal 24. The vacuum source is actuated, and accordingly a partial vacuum is established inside the CRT.

The terminals 28 are used to connect the rods 8, and thus the two ends of the filament 32, to a regulated alternating current source 46. One of the terminals 28 is also connected to a biasing potential source 48 which places the filament at a potential of minus 3 to 4 kV relative to the crucible 38. A beam current sensor 50 is connected to the source 48.

The alternating current provided by the source 46 heats the filament 32 to achieve thermionic emission. Electrons emitted from the filament are attracted to the crucible 38 by virtue of the potential difference existing between the filament and the crucible, and the electrons impinge on the crucible, thus heating the crucible. Consequently, the aluminum charge in the crucible in heated and is ultimately evaporated, and the resulting aluminum vapor condenses on the internal surface of the CRT, metallizing the faceplate 4 and the forward part of the funnel 6.

When a new filament is first heated, it normally deposits a light conductive coating on adjacent surfaces. The recessing of the upper end of the rod assembly serves to screen the internal surface of the sleeve 36 from the filament, thus preventing the coating from being deposited on the sleeve 36 and degrading its insulating properties. In addition, the sleeve 36 is protected from direct heat radiation from the filament at its point of closest proximity to the filament. The recessing of the upper end of the rod assembly also serves to focus the emitted electrons so that they are directed predominately towards the crucible.

It will be seen from FIG. 2 that the sleeve 36 has holes 58 in its wall. These holes are provided in order to enable rapid pump-out of the filament space. When the filament is heated, the gas in the filament space expands. Without the holes 58, the gas pressure in the filament space may reach a level such that it becomes electrically conductive, with the result that the high voltage supply is effectively shorted.

The metal sleeve 52 includes a portion 60 extending above the flange 54. The height and diameter of this portion 60 determines the size of the area of the CRT that is metallized, since regions of the internal surface of the CRT that are shaded from the interior of the crucible by the portion 60 will not receive a significant coating of aluminum. Thus, use of different sleeves 52 enables the apparatus to be adapted to achieve the desired metallization of CRTs of different sizes and shapes.

It will be appreciated that the described apparatus avoids the disadvantage of the conventional aluminizing technique, and employs E-beam impingement for evaporating the aluminum. The graphite crucible is less reactive with aluminum than the tungsten filament of the conventional aluminizing apparatus, and therefore the described apparatus avoids the disadvantage of the previously-conventional equipment. The crucible may be provided with a coating of alumina of silicon carbide to reduce still further the propensity for its reacting with the molten aluminum. A metal may not generally be used for the crucible, because most metals react with molten aluminum. It is, however, necessary that at least the portion of the crucible facing the filament be conductive, in order to enable electrons impinging on the crucible to be conducted away and thus maintain the potential difference between the filament and the crucible. The material that is selected for the crucible must be capable of withstanding the high temperatures involved and of resisting sudden temperature changes.

It will be appreciated that the invention is not restricted to the particular apparatus and method which have been described, since variations may be made therein without departing from the scope of the invention as defined in the appended claims, and equialents thereof.

We claim:

1. A method of depositing a coating of metallic material on the internal surface of a hollow object which is formed with an opening defined by an elongate neck for providing access to the interior of the object, comprising disposing an elongate member and the hollow member so that the elongate member extends upwardly into the interior of the object by way of the opening, one end of the elongate member being inside the hollow object while an opposite end of the elongated member is outside the object, said elongate member including mutually electrically-insulated conductors extending from said one end to said opposite end, a filament having two opposite ends connected to said conductors respectively at said one end of the elongate member, and a crucible containing metal to be deposited and supported at said one end of the elongate member above the filament and in spaced relationship thereto, at least a portion of the surface of the crucible facing the filament being electrically conductive, and said method also comprising supplying current to said filament by way of said conductors for heating said filament to achieve thermonic emission, and connecting the filament and said portion of the crucible to negative and positive terminals respectively of a potential source so that electrons emitted by the filament are accelerated towards the crucible and cause the crucible to be heated by electron bombardment.

2. A device for use in depositing a coating of metallic material on the internal surface of a hollow object which is formed with an opening defined by an elongate neck for providing access to the interior of the object, comprising an elongate member having a first end which is insertable into the interior of the object by way of the opening, and a second end which remains outside the object, said elongate member including two mutually electrically-insulated conductors extending from said first end to second end, a filament having two opposite ends connected to said conductors respectively at said first end of the elongate member, whereby current can be supplied to said filament by way of said conductors for heating said filament to achieve thermionic emission, a crucible for containing metal to be deposited, at least a portion of the crucible being electrically conductive, support means for mounting the crucible at said first end of the elongated member and in spaced relationship from the filament and with said portion of the crucible facing the filament, and means for connecting said portion of the crucible to the positive terminal of a potential source while the filament is connected to the negative terminal of the source so that electrons emitted by the filament are accelerated towards the crucible and cause the crucible to be heated by electron bombardment.

3. A device according to claim 2, wherein said elongate member comprises two rods of conductive material, constituting said conductors respectively, and means for securing the rods together in electrically insulating manner.

4. A device according to claim 3, wherein the rods define a recess at said first end of the elongate member and the filament is located at least partially within the recess.

5. A device according to claim 4, wherein the support means comprise a sleeve of insulating material adapted to be fitted over the first end of the elongate member and having an open end in which the crucible can be located, the sleeve being shielded from the filament in use.

6. A device according to claim 3, wherein the support means comprise a sleeve of insulating material adapted to be fitted over the first end of the elongate member and having an open end in which the crucible can be located.

7. A device according to claim 6, wherein said portion of the crucible includes a rim thereof, which rim is adapted to engage the open end of the sleeve, and the means for connecting said portion of the crucible to the positive terminal of the potential source comprise a conductive sleeve which is adapted to fit over the insulating sleeve and which has an internal flange for engaging the rim of the crucible, and a conductive, resiliently extendible member which is mechanically connectable to the sleeve and is adapted to be electrically connected to the positive terminal of the potential source.

8. A method according to claim 1, wherein the hollow object is a cathode ray tube which has a faceplate having an inner surface bounding the interior of the cathode ray tube, and the coating of metallic material is formed on said inner surface of the faceplate.

* * * * *